United States Patent [19]
Sakai et al.

[11] Patent Number: 5,576,538
[45] Date of Patent: Nov. 19, 1996

[54] APPARATUS AND METHOD FOR ION BEAM NEUTRALIZATION

[75] Inventors: Katsuhiko Sakai, Mito; Osamu Nasu, Katsuta; Yoichi Ose, Mito, all of Japan

[73] Assignee: Hitachi, Ltd., Tokyo, Japan

[21] Appl. No.: 411,150

[22] Filed: Mar. 27, 1995

Related U.S. Application Data

[63] Continuation of Ser. No. 20,802, Feb. 22, 1993.

[30] Foreign Application Priority Data

| Feb. 21, 1992 | [JP] | Japan | 4-033787 |
| Jun. 8, 1992 | [JP] | Japan | 4-147195 |
| Jul. 30, 1992 | [JP] | Japan | 4-202782 |

[51] Int. Cl.[6] .................................................. H05H 3/00
[52] U.S. Cl. ............................................................ 250/251
[58] Field of Search ............................... 250/492.21, 251, 250/398

[56] References Cited

U.S. PATENT DOCUMENTS

| 4,118,630 | 10/1978 | McKenna et al. | 250/492.21 |
| 4,361,762 | 11/1982 | Douglas | 250/492.21 |
| 4,419,203 | 12/1983 | Harper et al. | 250/251 |
| 4,595,837 | 6/1986 | Wu | 250/492.21 |
| 4,806,829 | 2/1989 | Nakao | 250/251 |
| 4,916,311 | 4/1990 | Fugishita et al. | 250/251 |
| 4,939,360 | 7/1990 | Sakai | 250/251 |
| 5,089,710 | 2/1992 | Kikuchi et al. | 250/492.21 |
| 5,399,871 | 3/1995 | Ito et al. | 250/492.21 |

*Primary Examiner*—Bruce C. Anderson
*Attorney, Agent, or Firm*—Antonelli, Terry, Stout & Kraus

[57] ABSTRACT

When a charged beam is irradiated on a sample, charge up of electric charge of the same polarity as that of the charged beam is built up on the sample surface. In order to neutralize the charge up electric charge, an apparatus for suppressing electrification of sample in charged beam irradiation apparatus is provided in which electric charge of opposite polarity to that of the charged beam is generated near the sample surface to neutralize the charged beam or charge up electric charge on the sample surface. The electric charge for neutralization is generated by admitting elecrtic charge from a plasma generation unit to the vicinity of the sample surface, ionizing gas generated from the sample surface by causing the charged beam to collide the gas or by irradiating electrons from an electron source on the sample surface. Especially when there is a possibility that impurities other than the electric charge for neutralization affect the sample adversely, an impurity generation source is blind folded with a cover so as not to be seen through from the sample and charged beam so that the impurities may be prevented from impinging upon the sample surface or intersecting the charged beam path.

22 Claims, 10 Drawing Sheets

APPARATUS AND METHOD FOR ION BEAM NEUTRALIZATION

This application is a Continuation of application Ser. No. 08/020,802, filed Feb. 22, 1993.

BACKGROUND OF THE INVENTION

The present invention relates to charged beam irradiation apparatus and more particularly to an apparatus for suppressing electrification of a sample in charged beam irradiation apparatus, which electrification suppressing apparatus suppresses electrification or charge up generated on a surface of the sample under irradiation of a charged beam.

For example, when an electronic circuit is formed by irradiating a charged beam on a semiconductor wafer standing for a sample, a sample surface is charged up by ions implanted in the sample to induce electric charge of opposite polarity to that of the charge up electric charge in the opposite side to the sample surface. As the charge up electric charge grows to exceed a breakdown voltage of the sample, the sample sometimes undergoes dielectric breakdown. Accordingly, for the purpose of neutralizing charge up electric charge generated on the sample surface, charged particles having opposite polarity to that of the charge up electric charge must be irradiated on the sample surface.

JP-A-2-87450 discloses a technique of preventing such charge up. According to the technique, electrons emitted from an electron gun are deflected toward the sample surface so as to be irradiated thereon and charge up on the sample surface built up positively by a positive ion beam is neutralized electrically by the electrons.

However, electrons generated from an electron source such as the electron gun are easy to concentrate at high density but have high energy which is 100 eV or more, with the result that a positively charged up portion can be neutralized sufficiently electrically but because of occurrence of a phenomenon that electrons irradiated on the neighborhood of the charge up portion charge the neighborhood negatively, the entire sample surface cannot be neutralized properly.

Accordingly, electrons used for neutralization of charge up are required to have small energy. Besides, in order to realize sufficient neutralization, electrons are required to exist at high density.

As a method of supplying low energy electrons for the purpose of neutralizing the sample surface, JP-A-61-47048 discloses a method utilizing secondary electrons and JP-A-4-51437 discloses a method in which electrons are decreased in speed to have low energy. JP-A-1-220350 discloses a method in which energy of electrons is lowered especially for the case where a sample is liable to suffer from damage by charge up.

Practically, however, it is very difficult to concentrate low energy electrons at high density because the electrons are caused to diffuse by repulsive action between them.

On the other hand, when a semiconductor wafer coated at its surface with resist is used as a sample, the charged beam irradiation apparatus is in general provided with a cylindrical member called a Faraday cage for measurement of ion beam current which is arranged near the sample to surround the ion beam path.

With the sample surface coated with resist, when an ion beam bombards the sample surface, such a gas as hydrocarbon is generated therefrom and particularly the amount of gas generated is large in the initial phase of bombardment. Structurally, the cylindrical Faraday cage facilitates rapid diffusion of the generated gas and raises a cause of reducing the effect of preventing charge up on the sample surface. More specifically, deficiency of gas near the sample surface leads to deficiency of low energy electrons generated by ionization of the gas under bombardment of ion beam and useful to neutralize the sample surface. Further, part or most of gas rapidly diffusing from the vicinity of the sample is discharged to the outside through an ion beam inlet opening of the cylindrical member and in consequence pressure is abruptly increased at an outside site which is in close proximity to the inlet opening in the initial phase of ion beam bombardment against the sample surface, so that the gas is ionized near the outer side of the opening to generate electrons which in turn combine with positive ions in the ion beam to neutralize particles in the beam. The neutral particles are admitted into the Faraday cage and therefore electrons and ions generated under the bombardment of ion beam cannot be detected by the Faraday cage, resulting in errors in a measured value of ion beam current. Since the ion beam current is a very important value in controlling the amount of ions implanted in the sample, it must be free from errors as far as possible.

Therefore, in order that gas generated from the sample surface can be utilized effectively for prevention of charge up on the sample surface and reduce measurement errors of ion beam current value can be reduced, it is necessary to suppress diffusion of generated gas from the vicinity of the sample surface as far as possible.

Incidentally, since the amount of electrons generated from only the generated gas is deficient to neutralize charge up on the sample surface, there needs a separate apparatus for generating electrons and irradiating the electrons on the sample surface. Namely, by using both the electrons generated owing to ionization of the generated gas and electrons from the electron source, sufficient electrons to neutralize the sample surface can be obtained. However, the apparatus using the generated gas and the electron source in combination in this manner faces the following problems. In the method as disclosed in JP-A-61-47048 which utilizes secondary electrons as an electron source, the amount of emitted secondary electrons depends on the surface condition of a secondary electron emission electrode (dynode) but the surface condition is affected by contamination due to, for example, sputtering by ion beam and disadvantageously becomes very unstable.

Further, the electron source uses a filament and tungsten or the like constituting the filament per se sometimes behaves as a contaminant substance; and besides the life of filament is relatively short, raising a problem in maintenance that the filament must be exchanged periodically.

Further, disadvantageously, the function of monitoring the degree of neutralization of ions caused by the electrons and controlling the supply amount of electrons properly is insufficient.

In addition, there arise problems that the sample is contaminated by plasma and source gas, the ion beam is contaminated by plasma and source gas, and the ion current cannot be measured accurately for a cause of a decrease in the degree of vacuum caused by the source gas.

Especially, as techniques of eliminating the adverse influence due to contaminant substances of high mass, other than electrons, emitted from the electron source, the following prior arts are available.

JP-A-2-54858 describes that in order to concentrate an electron beam for neutralization of ion beam on the neighborhood of a wafer irradiated with an ion beam, an electron beam drawn out of an electron source is deflected by a deflector.

Also, JP-A-3-25846 describes that an electron source is provided at a position remote from an ion beam irradiation area and electrons are transported to the ion beam irradiation area through transport means having a low conductance against gas for generation of electrons.

In JP-A-2-54858, the electron source is masked with the deflector to mitigate the problem of contamination but the necessity of the deflector and a power supply unit for deflection makes the apparatus complicated and large-sized, raising a problem that reliability and cost performance are degraded. Especially, in spite of the fact that contaminant substance does not impinge directly upon the sample surface, the contaminant substance collides with ions in a beam when it flies across the ion beam path and disadvantageously it sometimes reaches the sample.

In the apparatus described in JP-A-3-25846, the remote disposition of the electron source makes the apparatus large-sized and the necessity of the transport means with pressure reduction means makes the apparatus complicated to disadvantageously reduce reliability of the apparatus and raise the cost thereof.

SUMMARY OF THE INVENTION

A first object of the invention is to provide an apparatus and method for suppressing elecrification of sample in charged beam irradiation apparatus, in which low energy electrons are concentrated at high density to suppress charge up generated when an ion beam is irradiated on a sample.

A second object of the invention is to provide an apparatus and method for suppressing electrification of sample in charged beam irradiation apparatus, in which gas generated from the sample surface under bombardment of ion beam is utilized efficiently for neutralizing charge up on the sample surface and besides errors in measurement of the ion beam current amount can be minimized.

A third object of the invention is to provide an apparatus and method for suppressing electrification of sample in charged beam irradiation apparatus, in which the adverse influence of contaminant substance particles generated from an electron source upon the sample can be mitigated as far as possible.

According to a first form of the invention, as an apparatus of generating charged particles for neutralization used for suppressing charge up built on the sample surface under irradiation of ion beam, a plasma generation source is used which forms a source gas into plasma by microwave discharge. In plasma, positive and negative charged particles are coexistent to provide, as a whole, an electrically neutral state in which a phenomenon of diffusion of charged particles due to the repulsive action between them is minimized, so that low energy charged particles can be generated at high density. When the plasma exists near the charged up sample surface, only a charged up portion of the sample surface can be neutralized effectively and yet an ion beam per se to be irradiated on the sample through the plama can be neutralized and then irradiated on the sample. Of course, only electrons necessary for neutralization may be drawn out of the plasma and may be admitted to the vicinity of the sample surface. Accordingly, the first form of the invention can accomplish the aforementioned first and third objects.

According to a second form of the invention, diffusion of gas discharged from a sample under the bombardment of ion beam to sites distant from the vicinity of the sample surface is suppressed to cause the gas to stagnate near the sample surface as far as possible. Consequently, the time for gas generated from the sample to stagnate near the sample surface is prolonged, with the result that the amount of gas near the sample surface is increased in the initial phase of ion bombardment and at the same time the gas amount does not decrease abruptly to increase the amount of electrons stemming from ionization of the gas under the bombardment of ion beam and useful for neutralization of sample surface potential, thereby mitigating a decrease in charge up prevention effect. Since rapid diffusion of the gas discharged from the sample to the outside of the vicinity of the sample surface is suppressed, the discharge amount of gas to the outside of the Faraday cage is decreased to reduce the rate of generation of ions and electrons by collision of gas flowing to the outside of the inlet opening of the Faraday cage with the ion beam, and errors in measurement of ion beam current can be decreased correspondingly. The second form of the invention can accomplish the first and second objects of the invention.

According to a third form of the invention, a neutralization purpose charged particle discharge chamber and a cover at the same potential as that at the wall surface of an ion beam irradiation chamber are provided in such a manner that the neutralization purpose charged particle discharge chamber cannot be seen through directly from the sample and the ion beam path, so that charged particles for neutralization are guided to the ion beam irradiation chamber through an opening defined by the charged particle discharge chamber and the cover. This prevents contaminant particles of, for example, tungsten discharged from the neutralization purpose charged particle discharge chamber from flying to the sample and prevents the contaminant particles from intersecting the ion beam path, thus suppressing the adverse influence of the contaminant particles upon the sample. And yet, charged particles for neutralization can be guided to the ion beam irradiation chamber by potential at the charged particle discharge chamber and cover.

DESCRIPTION OF THE PREFERRED EMBODIMENTS

Figure 8:
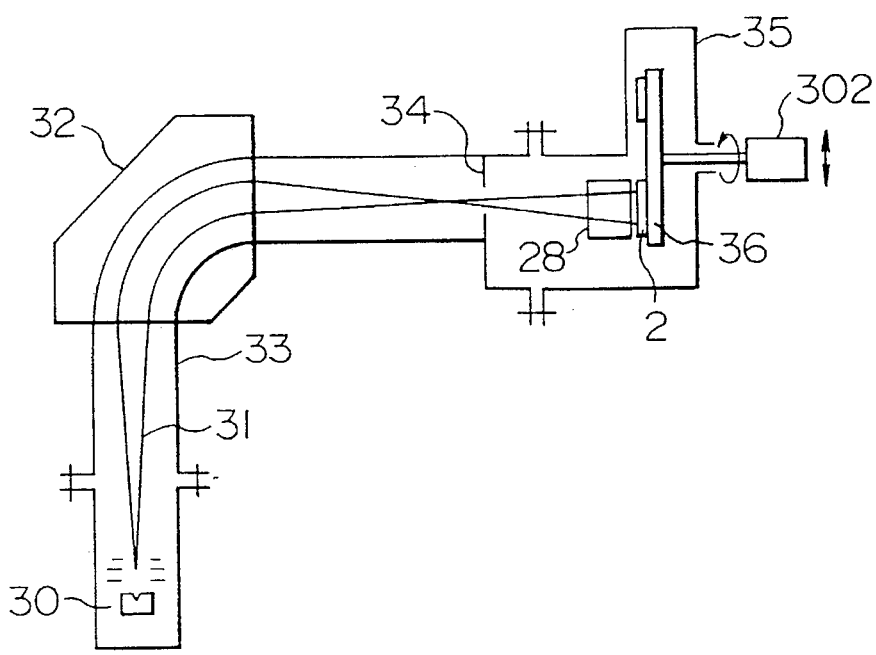
FIG. 8 is a diagram showing the overall construction of a charged beam irradiation apparatus according to the invention.

FIG. 8 is a conceptual diagram showing the overall construction of the present invention. Referring to the figure, an ion beam, emitted from an ion source 30 and accelerated, undergoes mass separation by a magnetic field generated by a magnet 32 for mass separation, and an ion beam of specified ion species obtained by the mass separation is delivered through a slit 34 for mass separation. The thus delivered ion beam is admitted to an ion implantation chamber 35 so as to be implanted into a semiconductor wafer 2 representative of a sample. A plurality of wafers 2 are held on a rotary disc 36 along the same circumference. A drive unit 302 rotates the rotary disc 36 at a high speed about the rotation center thereof and at the same time the drive unit can be moved, along with the rotary disc 36, in the up-and down direction in the illustrated apparatus. This causes the rotary disc 36 to be scanned in two directions, that is, radial and rotational directions with respect to the ion beam and as a result, ion implantation into the entire surface of all of the wafers 2 held on the rotary disc can be carried out sequentially.

The ion source 30, the wafers 2 and the rotary disc 36 holding them are arranged in the ion implantation chamber 35 which is a vacuum vessel evacuated to vacuum. An apparatus 28 for suppressing electrification of sample according to the invention is arranged near the wafer 2 to surround a path through which the ion beam passes.

Embodiments according to a first form will now be described with reference to FIGS. 1 to 7.

Figure 1:
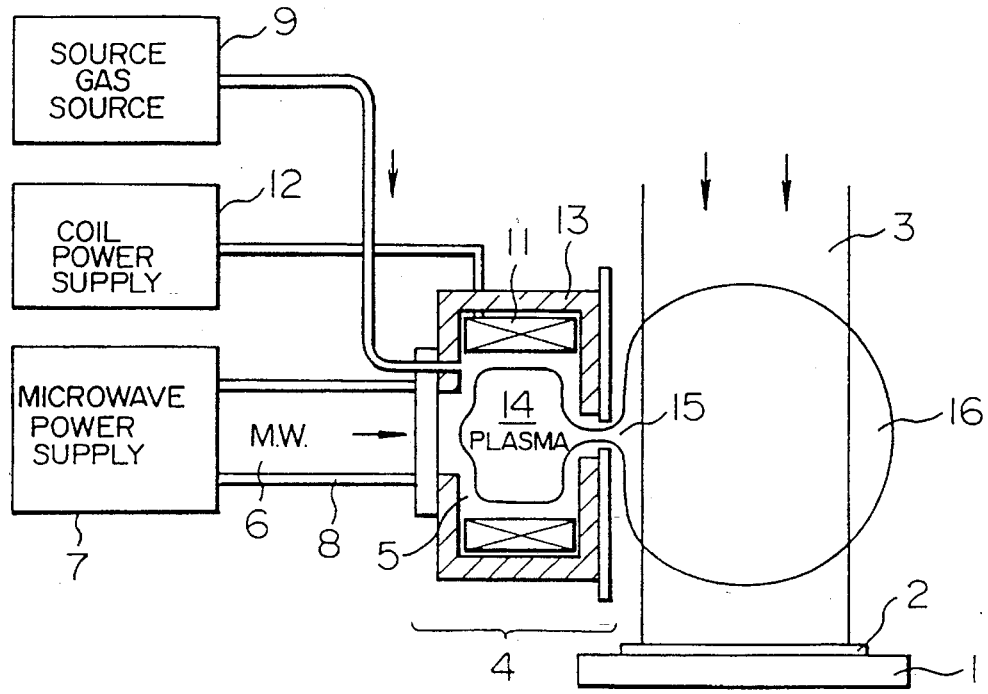
FIG. 1 is a diagram showing the construction of an embodiment according to a first form of the invention in which an ion beam is neutralized by plasma.

In FIG. 1, a platen 1 is fixed on the rotary disc 36 of FIG. 8 and a sample or workpiece, for example, a semiconductor wafer 2 is carried on the platen. An ion beam 3 is irradiated on the wafer 2 to perform such a treatment as implantation of ions into the wafer, etching or sputtering. Plasma 16 is supplied from a plasma source 4 so as to cover the whole of a path of ion beam 3. The ion beam 3 is neutralized by low energy electrons at high density contained in the plasma and a neutralized ion beam is irradiated on the workpiece 2. Consequently, the workpiece 2 can be prevented from dielectric breakdown due to charge up.

A source gas is supplied from a source gas source 9 to a dischage chamber 5 of the plasma source 4. The source gas is brought into the electron cyclotron resonance condition under the application of a magnetic field formed by a solenoid coil 11 and under the irradiation of a microwave 6 to form plasma 14 at high density.

The plasma 14 goes out of a plasma outgoing aperture 15 of the discharge chamber 5 and turns into plasma 16. Since the plasma 16 will not be accelerated by any electric field, energy of electrons contained in the plasma has a low level of, for example, several of eV or less and the electrons neutralize the ion beam 3 effectively.

Also, in the plasma 16, the amount of positive ions in the source gas substantially balances with the amount of space charge due to the electrons, with the result that diffusion of the electrons attributable to repulsive force between them can be suppressed to confine the plasma 16 within the irradiation range of ion beam 3.

Positive ions in the source gas will be deposited on the inner wall surface of the charged particle beam irradiation chamber but there is fear that they will contaminate the workpiece 2.

Heavy metals will do the greatest damage to the semiconductor wafer typically representative of the workpiece 2. Accordingly, in the present invention, a gas not containing any heavy metal components, for example, an inert gas of high purity may preferably be used as the source gas. In addition, the discharge chamber 5 is made of such a material not containing any heavy metals as boron nitride to prevent discharge of heavy metals from the discharge chamber 5.

The workpiece 2 is placed at a site which is not directly seen from the plasma source to make it difficult for unexpected heavy metals from the discharge chamber 5 to reach the workpiece 2.

Microwave 6 is generated by a microwave power supply 7 and admitted to the interior of discharge chamber 5 by, for example, a waveguide 8 or a coaxial cable. The aforementioned magnetic field may be formed in the direction of propagation of microwave 6 by exciting the solenoid coil 11 with a coil power supply 12 or by means of a permanent magnet.

Electrons stemming from ionization of the source gas by the microwave 6 undergo ECR (Electron Cyclotron Resonance) under the influence of the magnetic field and the ionization is promoted. To this end, for example, the microwave 6 is set to have a frequency of 2.45 GHz and the magnetic field inside the discharge chamber 5 is set to about 875 gauss.

Figure 2:
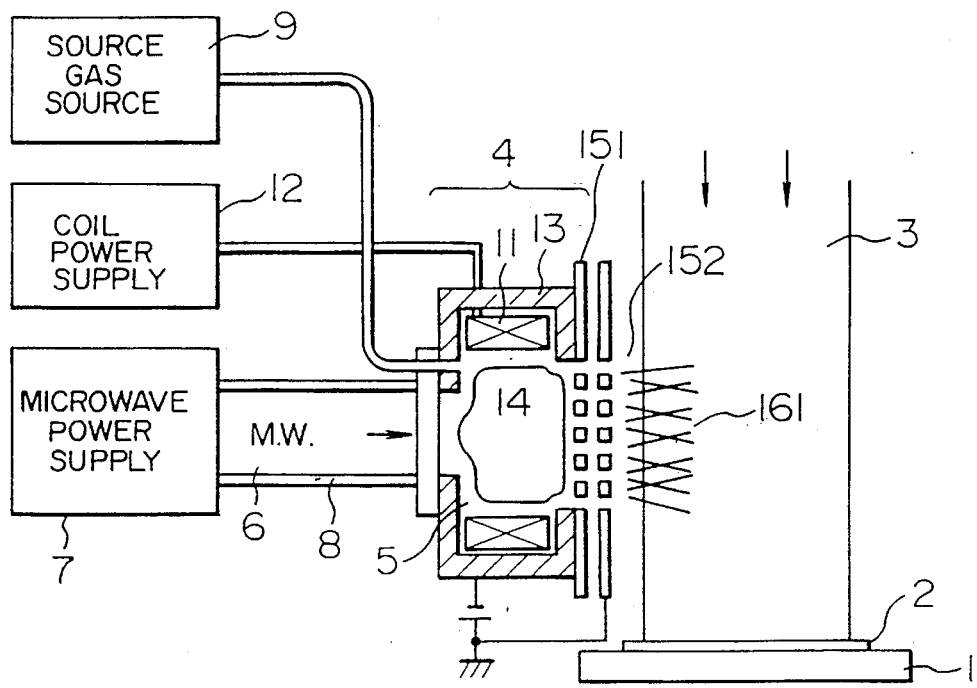
FIG. 2 is a diagram showing the construction of another embodiment of the first form according to the invention in which an ion beam is neutralized by electrons derived from plasma.

FIG. 2 is a partial sectional view of an embodiment of the invention in which only electrons are taken out of plasma 14 inside the discharge chamber 5 of FIG. 1.

In FIG. 2, the plasma outgoing aperture 15 in FIG. 1 is replaced with a grid-like electron outgoing aperture 151 and another grid-like electron outgoing aperture 152 is provided so that between the two, an electric field may be formed by which electrons are drawn out toward ion beam 3.

With the construction of FIG. 2, only electrons 161 are supplied to the ion beam 3 and therefore fear of contamination of workpiece 2 by positive ions of the source gas can be eliminated. By adjusting the electric field between the electron outgoing apertures 151 and 152, free setting of the energy level of supplied electrons 161 can be ensured to advantage.

Figure 3:
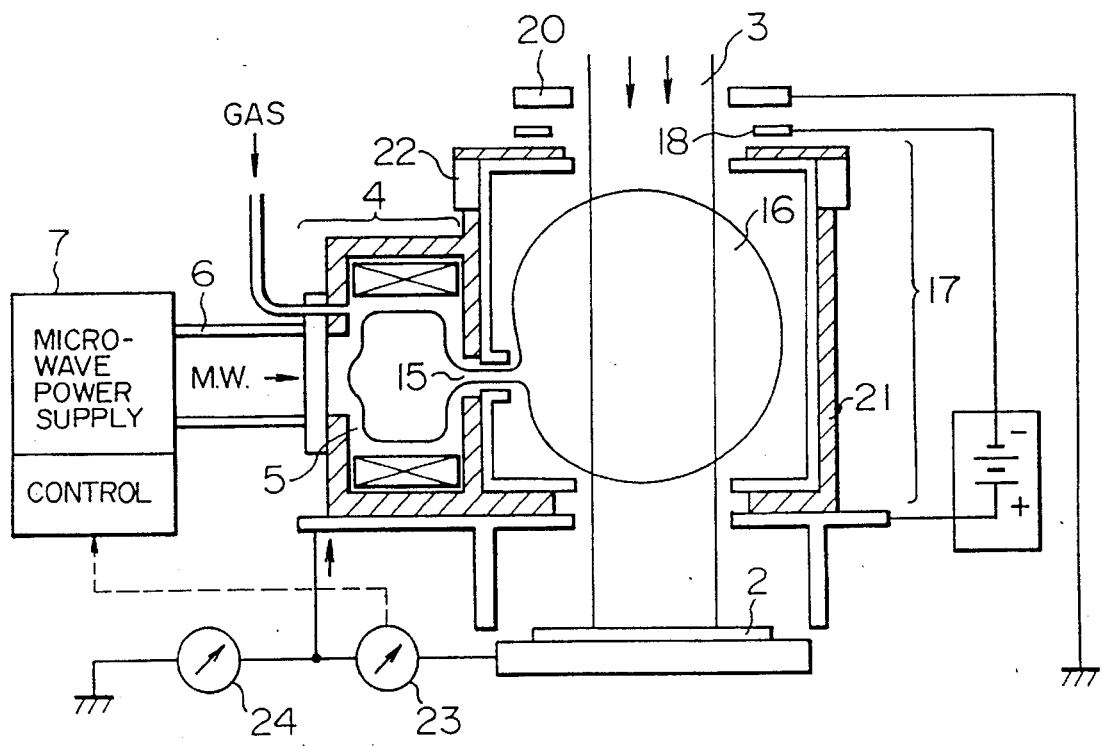
FIGS. 3 and 4 are sectional views respectively showing embodiments of the invention in which the apparatus of FIGS. 1 and 2 are respectively combined with a Faraday cage for ion beam current measurement.
Figure 4:
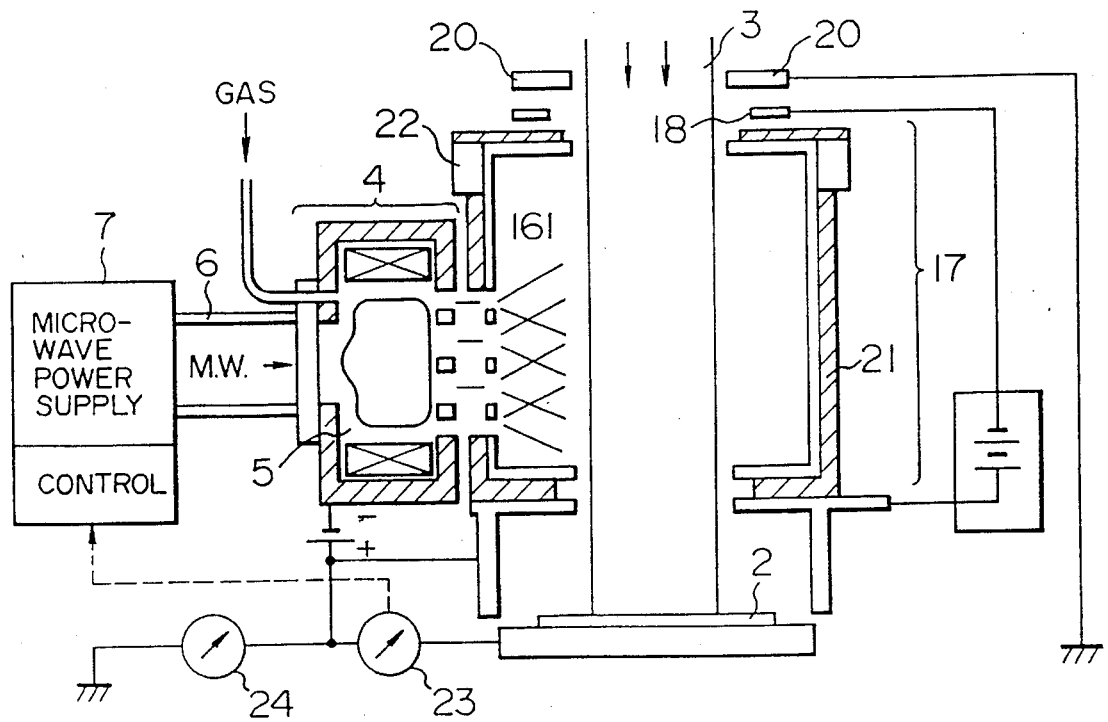

FIGS. 3 and 4 are diagrams showing the construction of other embodiments of the invention in which the apparatus of FIGS. 1 and 2 are respectively combined with a Faraday cage 17 in order that ion beam current can be measured and at the same time the ion beam current can be fed back to the microwave power supply 7 to control the amount of plasma 16 or the amount of electrons 161. For convenience sake, descriptions concerning FIGS. 3 and 4 will proceed in parallel.

In FIG. 3, plasma 16 is admitted to ion beam 3 through a plasma inlet aperture, of the Faraday cage 17, which is in communication with the plasma outgoing aperture 15.

In FIG. 4, electrons 161 are admitted to ion beam 3 through a grid of the Faraday cage 17. In FIG. 4, the grid of the Faraday cage 17 fills the role of the electron outgoing aperture 152 of FIG. 2.

A permanent magnet 22 and its magnetic path 21 are provided around the outer periphery of the Faraday cage 17 to form a magnetic field in the Faraday cage 17 in a direction coaxial with the ion beam 3 so that plasma 16 and electrons 161 may be confined within ion beam irradiation space. A multi-pole line cusp magnetic field can be formed around the outer periphery of the Faraday cage 17 with the aim of suppressing loss of plasma 16 and electrons 161.

Further, a suppressor electrode 18 applied with negative voltage is provided at an inlet port for ion beam 3 in order to prevent the incoming of electrons contained in the ion beam 3.

An earth electrode 20 provided above the suppressor electrode 18 limits the ion beam 3 and at the same time prevents the irradiation of ion beam 3 on the suppressor electrode 18.

In principle, a current due to plasma generated in the discharge chamber 5 flows through a current path set up between the discharge chamber 5 and workpiece 2 and therefore can be detected by means of an ammeter 23.

A current component due to the ion beam 3 also passes through the ammeter 23. The ion beam current and the plasma current flow in opposite directions and therefore an indication value on the ammeter 23 becomes zero when the ion beam current is completely neutralized by electrons in the plasma. The ion beam current can be detected separately by means of an ammeter 24 as shown in the figure.

Accordingly, in the invention, by feeding an output of the ammeter 23 back to the microwave power supply 7 to control the density of plasma 16 such that the output of the ammeter 23 becomes zero, the ion beam can be neutralized perfectly.

Practically, depending on objects and characteristics of apparatus, the output of the ammeter 23 may be displaced suitably from zero.

Generally, ionization of the source gas is carried out by utilizing the aforementioned ECR and the plasma density obtained in that case is determined by microwave intensity and magnetic field intensity.

Accordingly, it might be envisaged that an indication value on the ammeter 23 is fed back to the magnetic field intensity to obtain similar effects but in this case there arises a problem that the resonance frequency of ECR also changes sensitively with the control of magnetic field intensity, leading to an unstable operation. More specifically, since the plasma output characteristic with respect to the change of magnetic field intensity has a peak, inversion of the gradient (gain) of resonance characteristic occurs on the upper side and lower side of the resonance frequency range and for example, if the gradient is stable on the upper side, it becomes unstable on the lower side, thus making it impossible to apply sufficient feedback near the resonance frequency. Contrary to this, when the output of the ammeter 23 is fed back to the microwave power supply 7, the resonance frequency less varies and stable operation can be obtained.

In accordance with another embodiment, potential on the surface of workpiece 2 can be fed back to the microwave power supply 7 in place of the output of the ammeter 23 and this method can be applied to the case where the workpiece 2 is a semiconductor wafer.

Generally, there exists on the surface of a semiconductor wafer a device area which is isolated by, for example, a silicon oxide film and charge up is built on this area by ion beam irradiation. With ion beam 3 neutralized perfectly, the amount of charge up becomes zero. Accordingly, by detecting surface potential on the wafer and feeding it back to the microwave power supply 7, the ion beam can also be neutralized perfectly. An embodiment to this effect is shown in FIG. 5.

Figure 5:
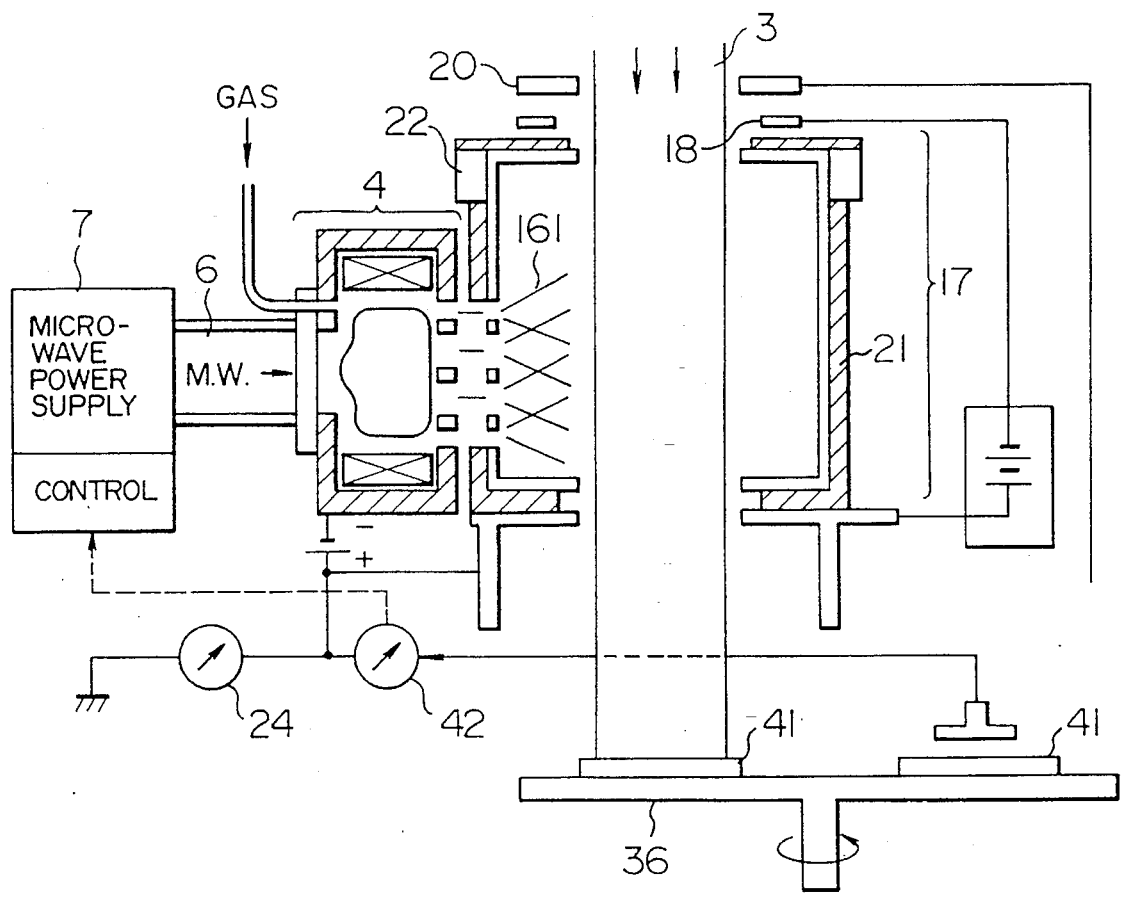
FIG. 5 is a sectional view showing another embodiment of the invention in which the apparatus of FIG. 2 is provided with a surface electrometer for semiconductor wafers.

In FIG. 5, a rotary disc 36 is rotated to sequentially move a plurality of wafers 41 carried thereon to a position on which ion beam 3 is irradiated. Surface potential on a wafer 41 having gone through irradiation of ion beam 3 is detected by means of an electrometer 42 and fed back to the microwave power supply.

In FIGS. 1 to 5, a small amount of raw gas which has not turned into plasma is sometimes mixed with plasma 16 supplied from the discharge chamber 5 and is deposited on the workpiece 2 to contaminate it detrimentally.

Figure 6:
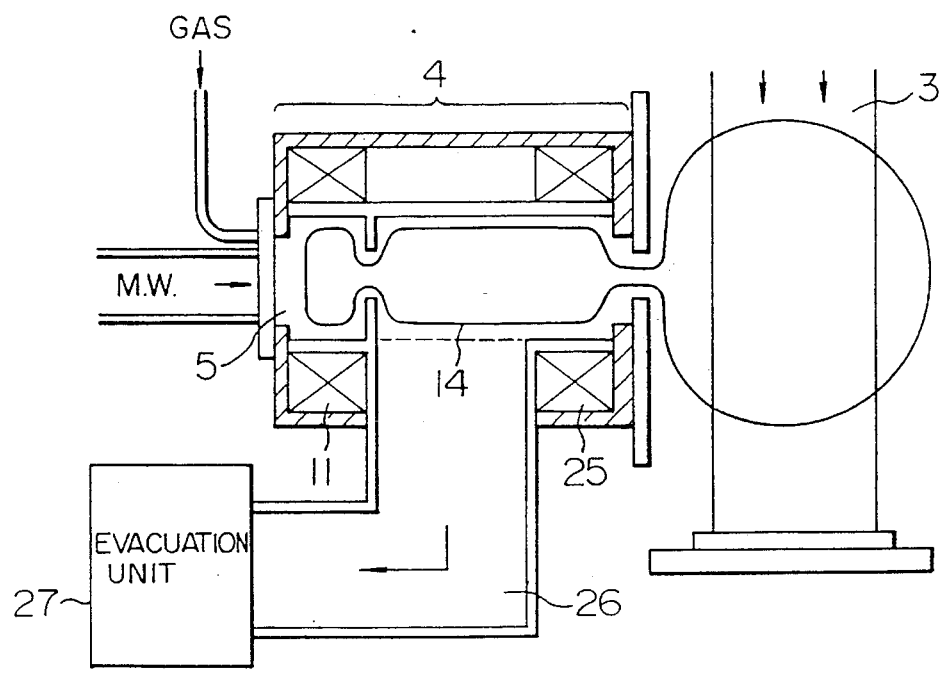
FIG. 6 is a sectional view showing an embodiment of the invention in which the apparatus of FIG. 1 is provided with a unit for evacuating raw gas in plasma.
Figure 7:
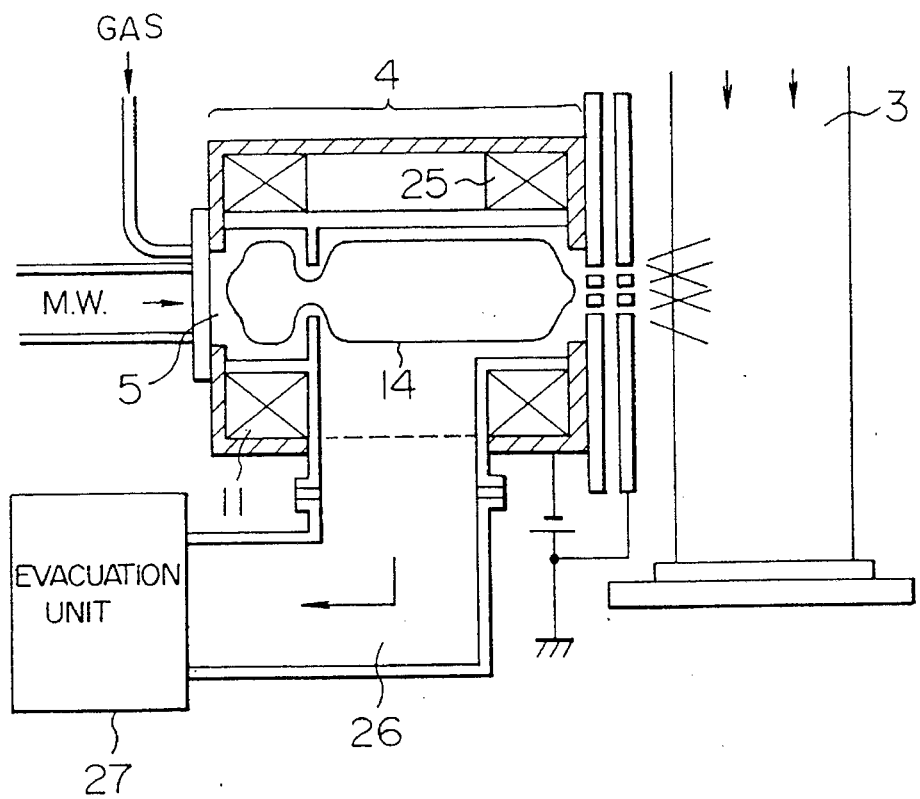
FIG. 7 is a sectional view showing an embodiment of the invention in which the apparatus of FIG. 2 is provided with a unit for evacuating raw gas in plasma.

FIGS. 6 and 7 are sectional views of embodiments of the invention comprising means for eliminating the raw gas so as to further improve the apparatus of FIGS. 1 to 5.

In FIGS. 6 and 7, raw gas not turning into plasma is evacuated through an evacuation pipe 26 by means of an evacuation unit 27. At that time, plasma 14 is confined within magnetic fields formed by solenoid coils 11 and 25 and as a result only the raw gas not turning into plasma can be evacuated.

Technical effects brought about by the embodiments of the invention shown in FIGS. 1 to 7 can be summarized as follows.

(1) Since electrons necessary for neutralization of an ion beam are taken out of plasma based on the electron cyclotron resonance, the electrons can be supplied stably.

(2) In the plasma, electrons and ions are coexistent and therefore space charges associated therewith can be cancelled out, so that the ion beam can be neutralized efficiently by supplying low energy electrons at high density.

(3) Energy of electrons is sufficiently low, amounting up to several of eV at the most and therefore danger to damage of workpieces of low breakdown voltage such as semiconductor wafers can be reduced.

(4) In contrast to the conventional apparatus, an electron source using a filament is not employed and therefore a workpiece such as a semiconductor wafer can be free from contamination attributable to the filament and exchange of filament can be unneeded, thus prolonging the life of apparatus, promoting cleanness of apparatus and making apparatus maintenance-free.

(5) Since an inert gas of high purity is used as the source gas of plasma, contamination attributable to the source gas, especially, contamination attributable to heavy metals can be prevented.

(6) By using the plasma source in combination with a Faraday cage, the ion beam can be measured accurately.

(7) By feeding a value of current flowing into the workpiece or charge up potential on the workpiece back to the microwave power supply, perfect ionization of the ion beam can be accomplished automatically.

(8) By setting up a suitable magnetic field in the Faraday cage, plasma or electrons can be confined within a space above the workpiece.

(9) By evacuating raw gas from the discharge chamber of the plasma source, leakage of the raw gas to the workpiece can be prevented to prevent the workpiece from being contaminated.

Embodiments according to a second form of the invention will now be described with reference to FIGS. 9 to 13.

Figure 9:
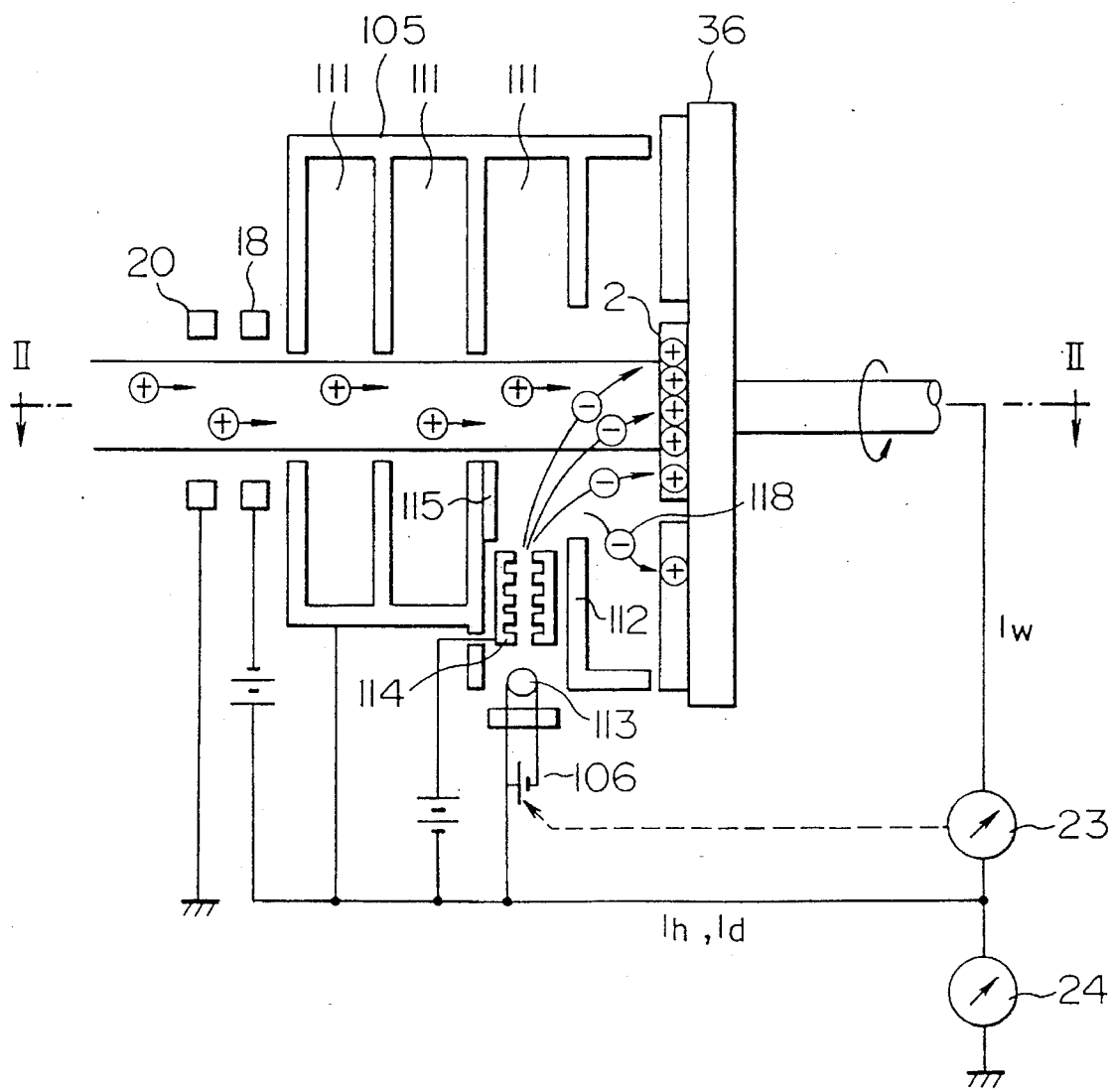
FIG. 9 is a sectional view showing the main part of an ion beam irradiation apparatus according to a second form of the invention.
Figure 10:
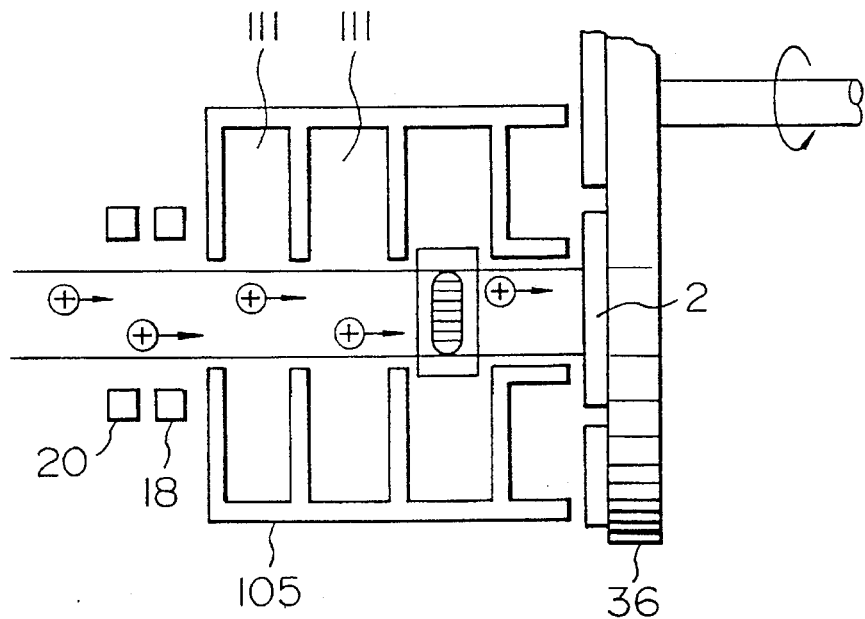
FIG. 10 is a sectional view taken on the line II-II of FIG. 9.

FIGS. 9 and 10 are diagrams showing a part corresponding to the apparatus 28 according to the invention shown in FIG. 8 and an ion beam current measuring system associated with the part. In the figures, an ion beam is shaped by an aperture 20 at earth potential and irradiated on a wafer 2 through a suppression electrode 18 and a cylindrical member 105 serving as a Faraday cage. Formed on the surface of the wafer 2 is a film or layer called resist. Current Iw caused by bombardment of the ion beam upon the wafer 2 flows through ion beam ammeters 23 and 24. When the wafer 2 is bombarded with the ion beam, reflection ions, secondary electrons and secondary ions are generated causing current Ih which flows through the ion ammeter 23. With the wafer 2 bombarded with the ion beam, a gas, mainly a hydrocarbon gas, is generated from the surface of the wafer. The generation of the gas is remarkable in the initial phase of ion beam bombardment. When the gas collides with the ion beam, it is ionized to generate ions and electrons. The ions and electrons are captured by the cylindrical member 105 to thereby cause current Id which flows through the ammeter 23. Ion beam current is represented by the sum of Iw, Ih and Id.

The suppression electrode 18 is supplied with a negative voltage and it therefore prevents electrons in the ion beam from entering the cylindrical member 105 and prevents electrons in the cylindrical member 105 from going out of the cylindrical member through an ion beam inlet.

The cylindrical member 105 is partitioned in the direction of ion beam to form a plurality of small rooms 111. Most of gas discharged from the sample 2 under the ion beam bombardment enters the small rooms 111 and then goes out slowly. Accordingly, diffusion of the gas into the vicinity of the surface of sample 2 is suppressed or retarded as compared to the case where the small rooms are not provided. In other words, the time for the gas to stagnate near the surface of sample 2 is prolonged. As a result, the amount of gas prevailing near the surface of sample 2 in the initial phase of ion beam bombardment is increased and is not decreased abruptly to permit the gas to be ionized under the bombardment of ion gas, so that the amount of electrons useful to neutralize sample surface potential to prevent the charge up prevention effect from being degraded. In addition, since abrupt diffusion of gas discharged from the sample 2 into the outside of the vicinity of the sample surface can be suppressed, the gas discharges slowly to the outside of the cylindrical member 105 through the ion beam inlet thereof. In consequence, the amount of gas discharge to the outside of the cylindrical member 105 in the initial phase of ion bombardment is decreased to reduce the chance that ions and electrons are generated exteriorly of the cylindrical member 105 under the ion beam bombardment and errors in measurement of ion beam current can be decreased correspondingly.

Figure 11:
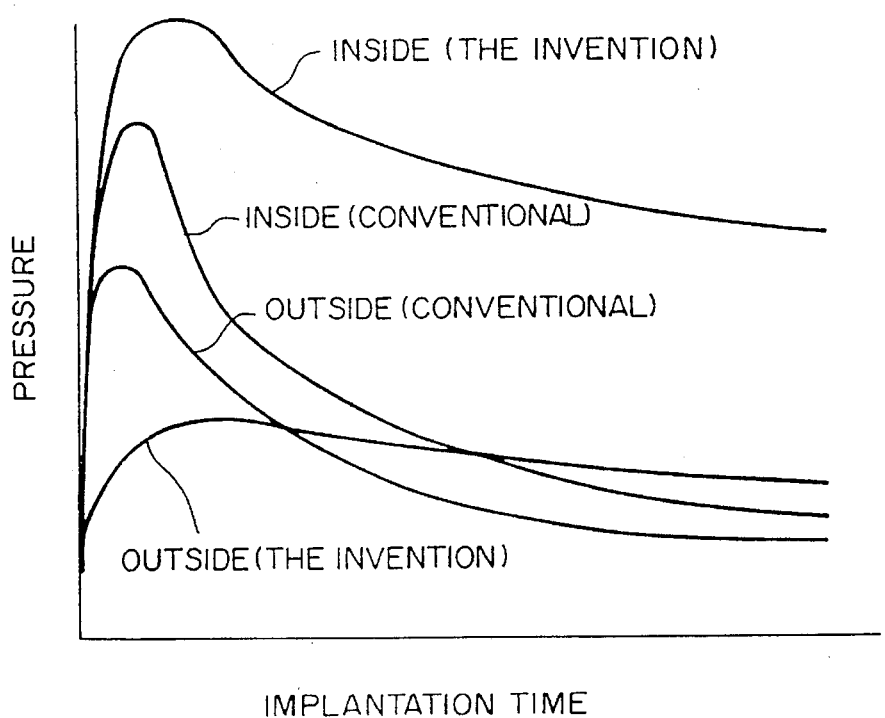
FIG. 11 is a diagram showing, for comparison of effects of the invention with those of a conventional example, characteristic curves indicative of the change with time of pressure prevailing interiorly and extriorly of the Faraday cup.

FIG. 11 shows the change of pressure with time near the sample surface and in the neighborhood of the ion beam inlet which is outside the cylindrical member. Represented by "inside" is data indicative of the time-varying change of pressure near the sample surface and by "outside" is data indicative of the time-varying change of pressure in the neighborhood of the ion beam inlet which is outside the cylindrical member. As is clear from the data, while in the case of a conventional example the pressure near the sample surface exhibits a peak in the initial phase of ion beam bombardmemt and then decreases abruptly, the pressure in the case of an example of the invention exhibits a peak value higher than that of the conventional example in the initial phase of ion bombardment and thereafter decreases gradually while maintaining a higher level. On the other hand, the pressure in the neighborhood of the beam inlet which is outside the cylindrical member maintains a level slighty lower than that near the sample surface and changes with time in substantially the same way as the pressure near the sample surface in the case of the conventional example but in the example of the present invention the pressure in the neighborhood of the beam inlet which is outside the cylindrical member is very low in the initial phase of ion beam bombardment in comparison with that of the conventional example and thereafter remains almost unchanged.

In order to obtain the gas stagnation effect, the inner wall of the small rooms 111 may be made to be uneven or instead of the provision of small rooms 111, the interior of the cylindrical member may be filled with a porous material such as active carbon.

Formed in the side of the cylindrical member is an opening at which there is provided a unit for generating a charged particle beam having opposite polarity to that of the ion beam, that is, an electron beam. In the unit, a filament 113 serving as an electron source is maintained at negative potential which is several volts and electrons generated from the filament are drawn out as an electron beam by means of a draw-out electrode 114 maintained at potential being about 1 kilovolt. Electrodes 115 and 112 for electron deflection are maintained at earth potential or at the same potential as that of the filament and the electron beam is deflected by a voltage between these electrodes and draw-out electrode 114 so as to be directed to the surface of the sample 2. Irradiation of the sample surface with electrons is useful for prevention of charge up due to irradiation of the sample surface with the ion beam, that is, neutralization of potential on the sample surface.

Figure 12:
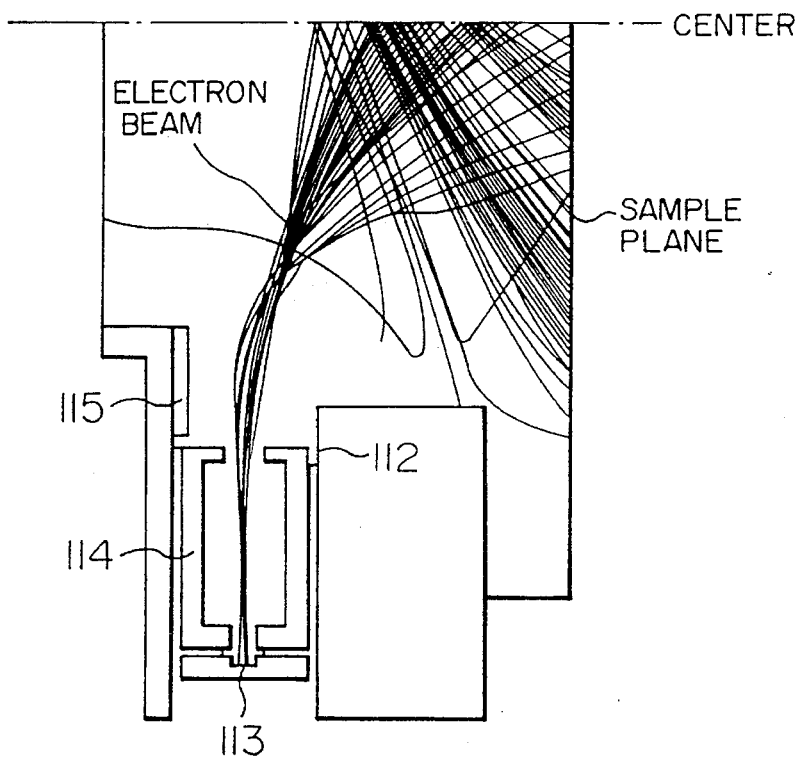
FIG. 12 is a diagram showing results of electron locus simulation in the embodiments of the invention shown in FIGS. 9 and 10.

FIG. 12 shows results of simulation of loci of electrons directed to the sample surface. In FIG. 12, only one electron beam generation unit is depicted but practically, another electron beam generation unit is provided at a position symmetrical to the illustrated electron beam generation unit with reference to the center line. Accordingly, electron locus simulation was effected on the presumption that the two electron beam generation units existed but in FIG. 12, only the half with reference to the center life is illustrated.

As described previously, the electrodes 115 and 112 for deflection are maintained at earth potential or at the same potential as that of the filament and any special power supply for electron deflection can therefore be dispensed with.

The filament 113 is located at a site which cannot be seen directly from the surface of the sample 2 and accordingly the sample surface can be prevented from being contaminated with vaporized substances generated from the filament. An electron passage aperture in the draw-out electrode 114 is made to be as thin as possible and as long as possible. This reduces the evacuation conductance of the electron passage aperture to reduce the chance that gas generated from the sample reaches the filament 113 and reduce a decrease in life of the filament.

The filament 113 is opened largely to vacuum inside the vacuum chamber 35 of FIG. 8. Therefore, the evacuation conductance of a path by way of which the filament communicates with vacuum via a space opened to the vacuum chamber is larger than the evacuation conductance of a path by way of which the filament communicates with vacuum via the electron passage aperture in the draw-out electrode, thus reducing the chance that the filament contacts gas molecules and further reducing a decrease in life of the filament.

Figure 13:
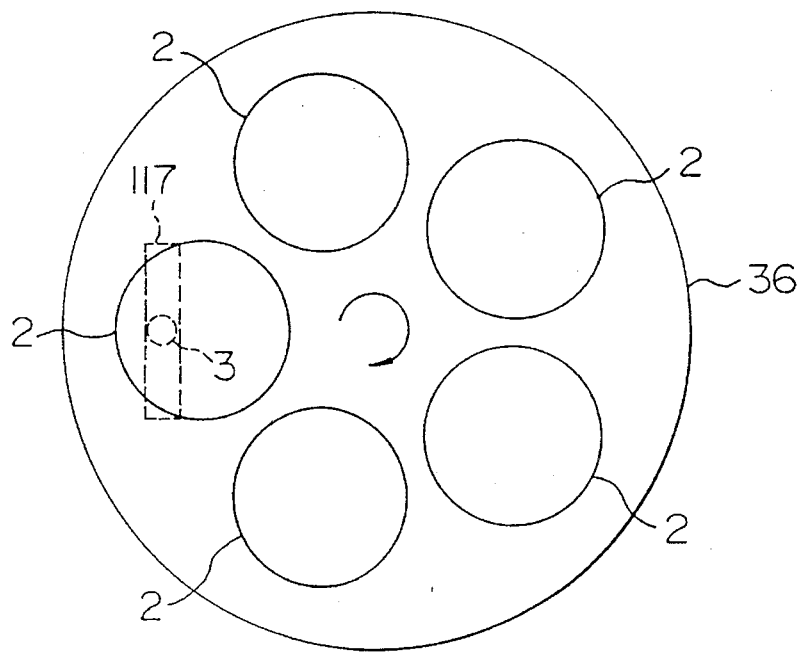
FIG. 13 is a plan view of a rotary disc as viewed in the direction of ion beam irradiation in the embodiments shown in FIGS. 9 and 10.

An ion beam outlet opening 117 or an opening nearby the sample of the cylindrical member 105 has a cross-sectional form which is, as shown in FIG. 13, more widened in a direction in which the sample is scanned by rotation of the rotary disc 36, that is, in the circumferential direction of the rotary disc than in the radial direction of the rotary disc. Ion beam 3 is irradiated on the sample 2 through an approximate center of the rectangular opening. Electrons are irradiated on the sample 2 through an approximate entirety of the opening 117. With this construction, a charge up portion generated on the surface of the sample under the bombardment of ion beam is moved, while being neutralized insufficiently by electrons, in the circumferential direction as the rotary disc 36 rotates and even after having escaped from the irradiation range of ion beam, it remains irradiated with electrons through the rectangular opening 117 which is elongated in the rotation direction, whereby neutralization of the charge up portion having escaped from the irradiation range of ion beam can be realized by electrons 118 irradiated through the opening 117 as shown in FIG. 9.

In the embodiment of FIG. 9, a current value on the ammeter 23 may be fed back to a power supply 106 of the filament 113 to effect neutralization of the sample through feedback control as explained with reference to FIGS. 3 and 5. By virtue of this feedback control, proper neutralization can be realized by both the electrons generated by ionization of generated gas and electrons irradiated from the electron source.

In FIG. 9, the plasma generation source as shown in FIGS. 1 to 5 may be used in place of the electron source using the filament.

Embodiments of the invention according to a third form will now be described with reference to FIGS. 14 to 16.

Figure 14:
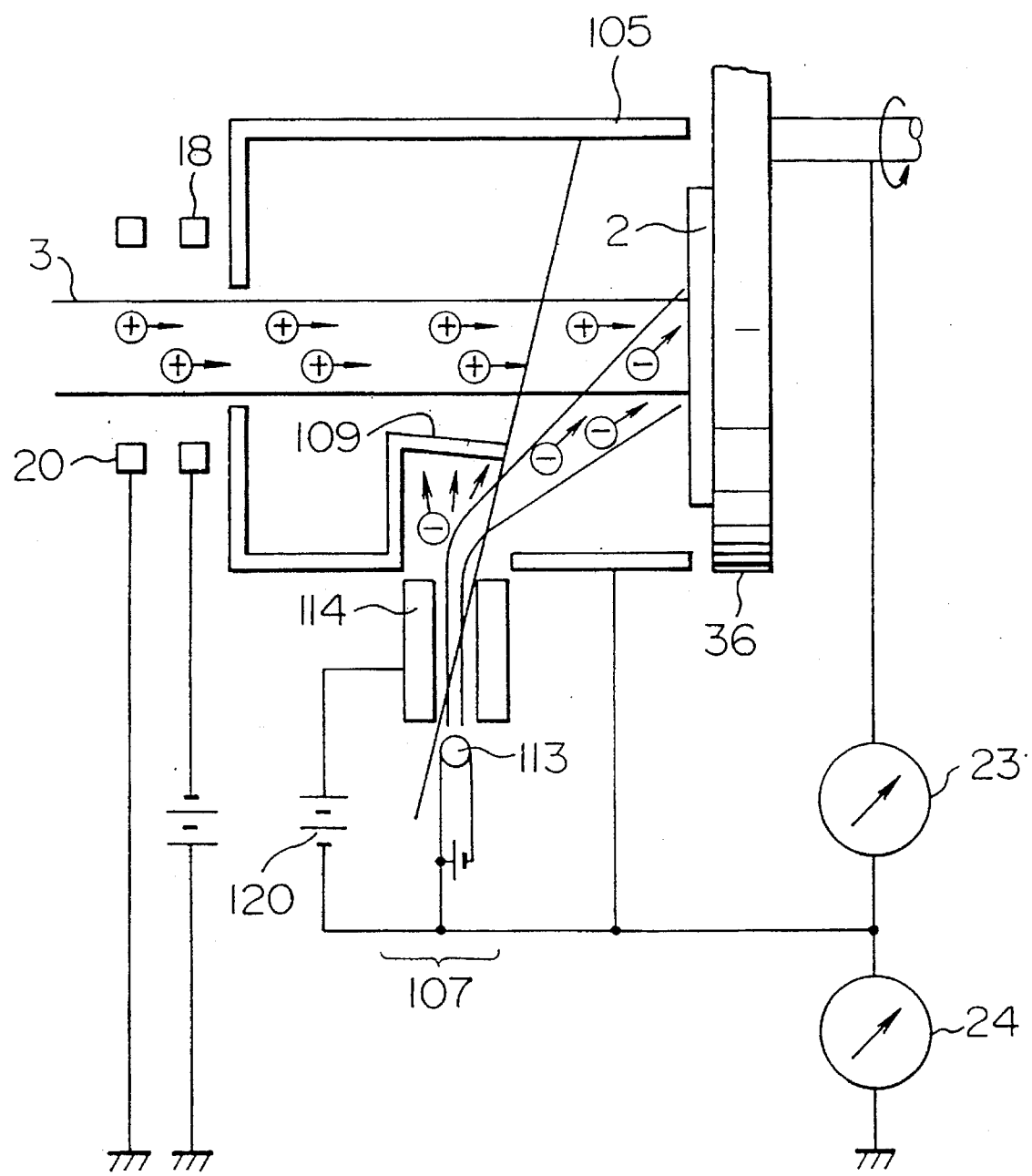
FIG. 14 is a sectional view of an embodiment according to a third form of the invention.

FIG. 14 is a sectional view showing an embodiment of an apparatus for suppressing electrification in charge beam irradiation apparatus according to the invention.

An ion beam 3 is passed through a grounded aperture 20 and a suppressor electrode 18 at negative potential and is irradiated on a sample 2.

A disc 36 and a Faraday cage 105 constitute a Faraday cup which captures ion beam 3 and ion beam ammeters 23 and 24 measure a current of ion beam.

Provided laterally of the Faraday cage 105 is an electron source 107 which includes a filament 113 and a cylindrical electron draw-out electrode 114.

Electrons emitted from the filament 113 are accelerated by the draw-out electrode 114 and go out of an opening of a cover 109 so as to be supplied to a sample 2 on the disc 36 of an implantation chamber.

The cover 109 is connected to the Faraday cage 105 and grounded through the ion beam ammeter 24.

The draw-out electrode 114 is connected to an acceleration power supply 120 to form a positive electric field near the opening of the cover 109, so that electrons are deflected toward the sample 2 as shown in the figure.

Mass of tungsten particles emitted from the filament 113 and of contaminant particles generated by ionization of residual gas is far heavier than that of an electron and therefore these contaminant particles go straightforwards without being affected by the positive electric field near the opening of the cover 109 and are captured thereby.

Thus, the size of cover 109 is made to be sufficiently large to cover the draw-out electrode 114 in order that the filament 113 cannot be seen from the sample 2 and ion beam 3, and the cover surface is so inclined as to narrow the opening slightly in order that particles of substances sputtered from the cover 109 under the bombardment of contaminant particles can be prevented from reaching the sample 2.

As described above, in the present invention, electrons can be deflected toward the workpiece 2 without applying any deflection voltage and at the same time contaminant particles can be captured efficiently by means of the cover 109.

The cover is made of a material of non-heavy metal such as silicon, carbon, aluminum or a synthetic substance of them to prevent any heavy metal particles from being sputtered under the bombardment of contaminant particles.

Figure 15:
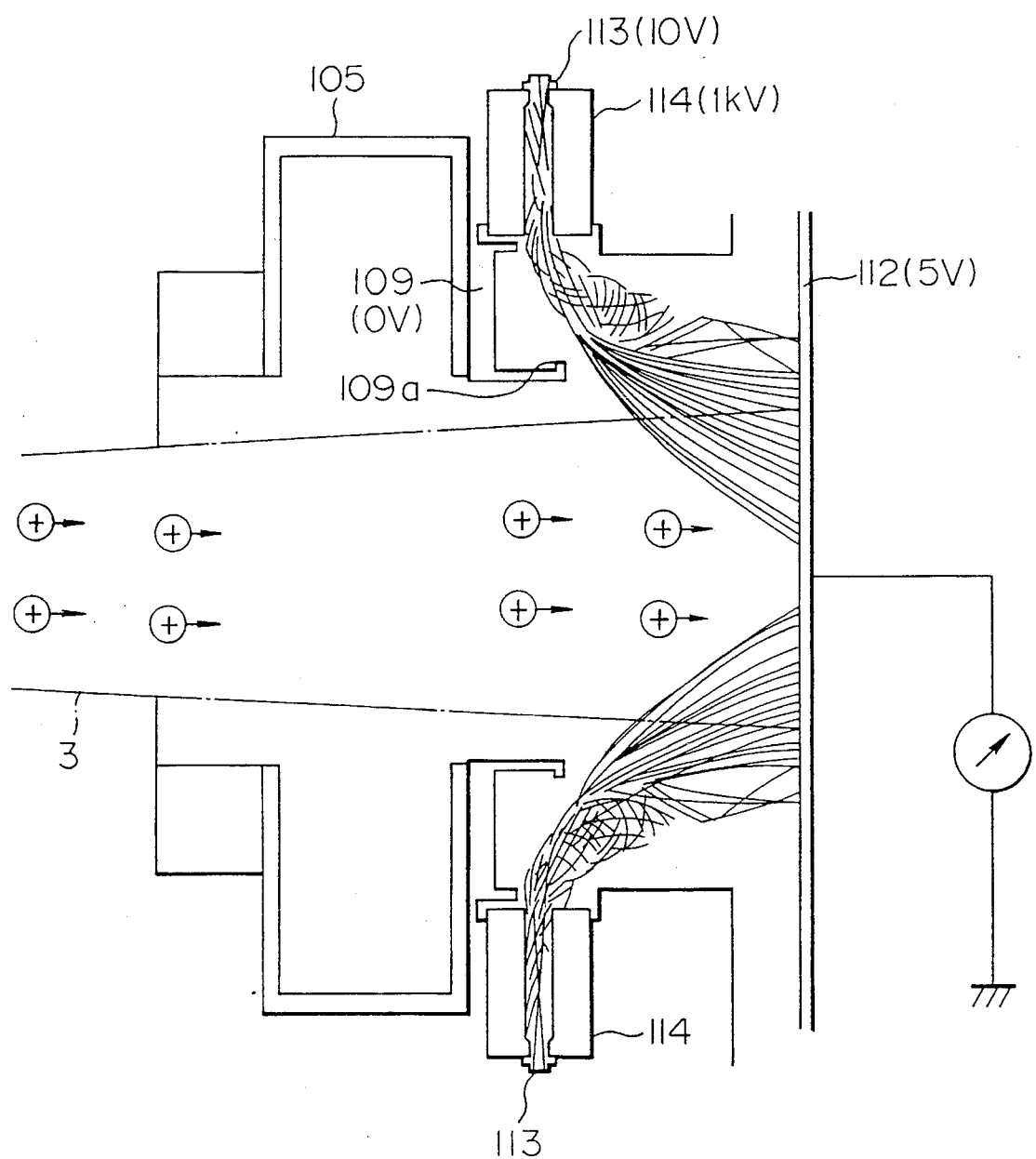
FIG. 15 is a diagram showing results of analysis of electron loci in the embodiment shown in FIG. 14.

FIG. 15 shows results of analysis of the deflected condition of electrons.

Shown in FIG. 15 is the case where two pairs of filament 113, draw-out electrode 114 and cover 109 are provided at upper and lower sites of the apparatus.

It will be seen that electrons are caused to pass through the opening of the cover 109 and to be deflected efficiently toward the sample 3 by a positive electric field formed by an accelerating voltage of the draw-out electrode 114.

Since in the invention electrons are deflected by the cover 109 at zero potential (earth), the power supply for deflection can be omitted.

In order to capture particles of substances caused to sputter under the bomardment of the contaminant particles, a bent portion 109a as shown is provided at the edge of the opening of cover 109.

Figure 16:
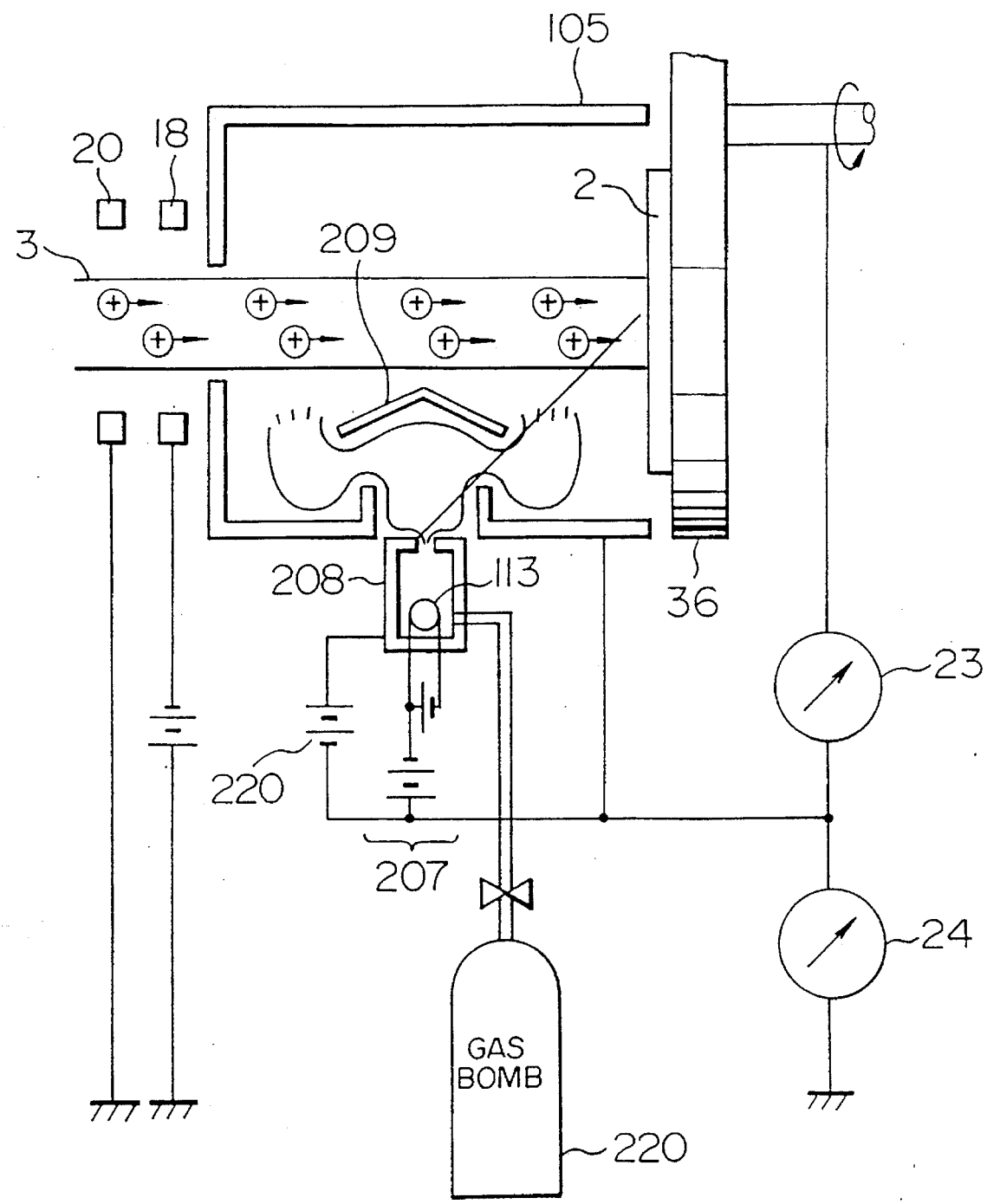
FIG. 16 is a diagram of another embodiment according to the third form of the invention.

FIG. 16 is a sectional view showing an embodiment of the invention in which an electrification suppressing apparatus based on plasma is provided in an ion implantation chamber of an ion implantation apparatus.

In the case where plasma is used for charge up suppression, a plasma source 207 is mounted to the sidewall of a Faraday cage 105 as in the case of FIG. 14.

Thermions emitted from a filament 113 in an arc chamber 208 cause a gas such as Ar or Xe fed from a gas bomb 220 to arc-discharge and turn into plasma.

Plasma can also be generated by a microwave, radio frequency or hollow type plasma generator. An ion beam or an electron beam can also be drawn out of the plasma.

The plasma is drawn by an electric field of power supply 220 applied to the arc chamber 208 and passes by a cover 209 provided near the outlet to move into the Faraday cage 105. The cover 209 is connected to the Faraday cage 105 and so maintained at earth potential.

The electric field by the power supply 220 spreads into a gap between the outlet of arc chamber 208 and cover 209 to guide plasma into the Faraday cage 105 effectively.

Contaminant substance such as sputtered matter scattering from the interior of the arc chamber 208 goes straightforwards and impinges upon the cover 209 so as to be captured thereby, thus being prevented from intruding into the Faraday cage 105. Thus, the cover 209 is so sized that ion beam 3 and filament 113 cannot be seen through from the sample 2.

The cover 209 is so configured that its inner surface is inclined to make it difficult for the contaminant substances to diffuse into the Faraday cage. In some cases, ultraviolet rays emitted from plasma affect the sample adversely but the ultraviolet rays can be shielded by the cover 209 in a similar way. When the cover 209 is made of a material such as glassy carbon of high purity, it will not be eroded by not only plasma but also ultraviolet rays.

As described above, in the present invention, plasma as well as ions and electrons in the plasma are drawn out by means of the cover 209 at zero potential (earth) and therefore the power supply for deflection can be omitted to simplify the apparatus; and besides contaminant particles can be captured efficiently by the cover 209.

We claim:

1. A method for neutralization of an ion beam, comprising the steps of:
    ionizing a source gas to form electrons and ions; and
    supplying only said electrons from the ionized source gas having the formed electrons and ions therein to the ion beam so as to enable neutralization of the ion beam.

2. A method according to claim 1, further comprising the step of irradiating the ion beam toward a sample so as to enable neutralization thereof.

3. A method according to claim 1, wherein the step of ionizing include ionizing the source gas by arc-discharge.

4. A method according to claim 1, wherein the step of ionizing includes ionizing the source gas by thermions.

5. A method according to claim 1, further comprising the step of separating said electrons from the ionized source gas having the electrons and ions therein prior to supplying only said electrons to the ion beam.

6. A method according to claim 5, wherein the step of separating includes separating low energy electrons at a high density from the ionized source gas and the low energy electrons are supplied with high density to the ion beam.

7. An apparatus for neutralization of an ion beam, comprising:
    means for ionizing a source gas to form electrons and ions; and
    means for supplying only said electrons from the ionized source gas having the formed electrons and ions therein to the ion beam so as to enable neutralization of the ion beams.

8. An apparatus according to claim 7, further comprising means for separating said electrons from the ionized source gas prior to supplying only said electrons to the ion beam.

9. An apparatus according to claim 8, wherein said means for separating includes means forming at least one grid having apertures for passing said electrons therethrough.

10. An apparatus for neutralization of an ion beam, comprising:
    means for ionizing a source gas for generating a plasma including electrons and ions; and
    means for supplying only said electrons from the generated plasma to the ion beam so as to enable neutralization of the ion beam.

11. An apparatus according to claim 10, wherein said source gas is an inert gas without heavy metal components.

12. An apparatus according to claim 10, wherein the ion beam is irradiated onto a sample, and further comprising:
    an ammeter for measuring an ion beam current flowing in a sample state holding said sample; and
    means for controlling a power for generating said plasma so that a measured value of said ammeter becomes a predetermined value.

13. A method for treating a workpiece, comprising the steps of:
    ionizing a source gas to form electrons and ions;
    supplying only said electrons from the ionized source gas having the formed electrons and ions therein to an ion beam so as to enable neutralization of the ion beam; and
    irradiating the neutralized ion beam to the workpiece to process the workpiece.

14. A method according to claim 13, wherein the process effected on the workpiece is implantation of ions into the workpiece.

15. A method according to claim 13, further comprising the step of separating said electrons from the ionized source gas having the electrons and ions therein prior to supplying only said electrons to the ion beam.

16. A method according to claim 15, wherein the step of separating includes separating low energy electrons at a high density from the ionized source gas.

17. An apparatus for treating a workpiece, comprising:
    means for ionizing a source gas to form electrons and ions;
    means for supplying only said electrons from the ionized source gas having the formed electrons and ions therein to an ion beam so as to enable neutralization of the ion beam; and
    means for irradiating said neutralized ion beam to the workpiece to process the workpiece.

18. An apparatus according to claim 17, wherein the process effected on the workpiece is implantation of ions into the workpiece.

19. An apparatus according to claim 17, further comprising means for separating said electrons from the ionized source gas prior to supplying only said electrons to the ion beam.

20. An apparatus according to claim 19, wherein said means for separating includes means forming at least one grid having apertures for passing said electrons therethrough.

21. An apparatus for treating of a workpiece, comprising:
    means for ionizing a source gas for generating a plasma including electrons and ions;
    means for supplying only said electrons from the generated plasma to an ion beam so as to enable neutralization of the ion beam; and
    means for irradiating said neutralized ion beam to the workpiece to process the workpiece.

22. An apparatus according to claim 21, wherein the process effected on the workpiece is implantation of ions into the workpiece.

* * * * *